United States Patent
Yamasaki et al.

(10) Patent No.: US 7,482,283 B2
(45) Date of Patent: Jan. 27, 2009

(54) THIN FILM FORMING METHOD AND THIN FILM FORMING DEVICE

(75) Inventors: Hideaki Yamasaki, Nirasaki (JP); Yumiko Kawano, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 894 days.

(21) Appl. No.: 10/450,161

(22) PCT Filed: Dec. 11, 2001

(86) PCT No.: PCT/JP01/10859

§ 371 (c)(1),
(2), (4) Date: Jun. 11, 2003

(87) PCT Pub. No.: WO02/48427

PCT Pub. Date: Jun. 20, 2002

(65) Prior Publication Data

US 2004/0029379 A1    Feb. 12, 2004

(30) Foreign Application Priority Data

Dec. 12, 2000    (JP)    ............. 2000-377675

(51) Int. Cl.
  *H01L 21/44* (2006.01)
  *H01L 21/31* (2006.01)
  *H01L 21/469* (2006.01)

(52) U.S. Cl. ............. 438/758; 438/764; 438/775; 438/685

(58) Field of Classification Search ............ 438/758, 438/685, 764, 778
See application file for complete search history.

(56) References Cited

U.S. PATENT DOCUMENTS

| 6,399,484 | B1 * | 6/2002 | Yamasaki et al. ........... 438/627 |
| 6,482,733 | B2 * | 11/2002 | Raaijmakers et al. ....... 438/633 |
| 6,534,395 | B2 * | 3/2003 | Werkhoven et al. ......... 438/627 |
| 6,773,687 | B1 * | 8/2004 | Hasegawa ................... 423/210 |
| 6,855,621 | B2 * | 2/2005 | Kondo et al. ................ 438/513 |

FOREIGN PATENT DOCUMENTS

| JP | 03-201425 | | 9/1991 |
| JP | 6-224138 | A | 8/1994 |
| JP | 11054459 | | 2/1999 |
| JP | 11172438 | | 6/1999 |
| JP | 2000160342 | | 6/2000 |
| JP | 2000-212752 | * | 8/2000 |
| JP | 2000-212752 | A | 8/2000 |

OTHER PUBLICATIONS

Japanese Office Action dated Dec. 4, 2007 (three (3) pages).

* cited by examiner

*Primary Examiner*—Chuong A. Luu
(74) *Attorney, Agent, or Firm*—Crowell & Moring LLP

(57) ABSTRACT

The present invention relates to a method and apparatus for forming a thin film using the ALD process. Prior to the ALD process where each of a plurality of source gasses is supplied one by one, plural times, a pretreatment process is performed in which the source gasses are simultaneously supplied to shorten an incubation period and improve throughput.

12 Claims, 8 Drawing Sheets

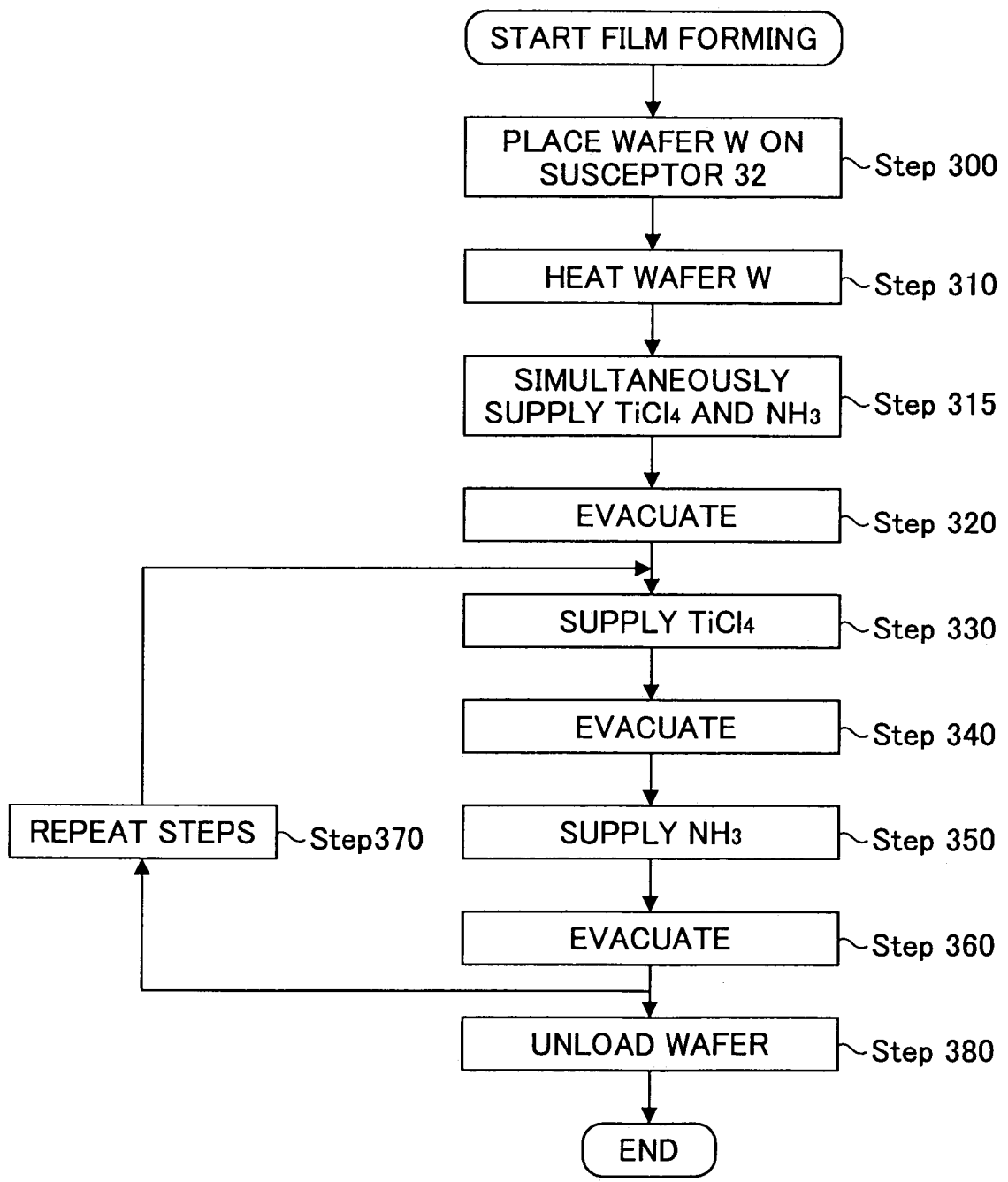

THIN FILM FORMING METHOD AND THIN FILM FORMING DEVICE

TECHNICAL FIELD

The present invention generally relates to methods and apparatuses for forming a thin film, and more particularly, to a method and apparatus for forming a thin film by supplying each of source gasses one by one.

BACKGROUND ART

As semiconductor integrated circuits become more microscopic and more integrated, insulating films, metal films and other films formed on a substrate (such as a semiconductor substrate) are desired to have less thickness, better coverage for complex shapes, macroscopic uniformity over the whole wafer and microscopic smoothness at the nanometer level. However, the conventional CVD process cannot satisfy at least a portion of the above desires.

At present attention is paid to the ALD (Atomic Layer Deposition) process as a film forming process that can satisfy the above desires. In the ALD process, each of different source gasses is supplied one by one, supplied source gasses are absorbed by a reactive surface and form a film at an atomic layer or molecular layer level, and get a thin film having a desired thickness by repeating the above process.

In more detail, a first source gas is supplied to the substrate to form its absorption layer on the substrate. Then, a second source gas is supplied to the substrate to cause them to react. In this process, the first source gas reacts with the second source gas after being absorbed, and therefore the temperature of the formed film can be lowered.

When forming a film at a hole, the ALD process can avoid coverage degradation problems resulting from the source gas reaction above the hole, which problem cannot be solved by the conventional CVD process.

The thickness of the absorption layer is generally a single layer, or at most two or three layers, of atoms and molecules, and is determined by its temperature and pressure. The absorption layer has self-controllability in which more than the necessary source gas for forming the absorption layer is exhausted out, and therefore the ALD process is suitable for controlling a very thin film. And each time the film forming process is performed at the atomic or molecular level, the reaction is easy to progress, and almost no impurity is left in the film, and therefore the ALD process is preferable.

However, the ALD process has a problem in that the total time required for forming a film becomes long because each time the film forming process is performed at the atomic or molecular level.

The ALD process has an incubation period in the first several cycles, during which no film is formed, that has seriously lowered throughput.

DISCLOSURE OF INVENTION

Accordingly, it is a general object of the present invention to provide an improved film forming method and apparatus that can solve the above mentioned prior art problem.

It is a more specific object of the present invention to realize a film forming method and apparatus that can shorten an incubation period encountered in the ALD process and improve throughput.

Another and more specific object of the present invention is to provide a method for forming a thin film on a substrate by causing a plurality of source gasses to react on the substrate, comprising the steps of (a) simultaneously supplying said plurality of source gasses; and (b) after the step of simultaneously supplying, supplying each different source gas of said plurality of source gasses one by one plural times to form a thin film.

According to this method, the incubation period can be shortened and throughput can be improved by carrying out a pretreatment process that simultaneously supplies a plurality of source gasses, prior to the step of supplying each different source gas of a plurality of source gasses one by one plural times using the ALD process.

It is preferable to evacuate or supply another different gas, between the supplying of each source gas of a plurality of source gasses. This can inhibit the supplied source gasses from causing unnecessary reaction.

It is preferable that the source gasses be $WF_6$ gas, $NH_3$ gas and $SiH_4$ gas. Thereby, a $WN_x$ thin film can be formed on the substrate.

It is preferable that the supply period for the step of simultaneously supplying a plurality of source gasses have a lower limit and an upper limit, the lower limit being 0.1 second and the upper limit being the same as a period during which a 2.0 nm thick film is formed. In this way, the incubation period can be effectively shortened.

Another object of the present invention is to provide a film forming apparatus for forming a thin film on a substrate by causing a plurality of source gasses to react on the substrate, comprising (a) means for simultaneously supplying a plurality of source gasses; (b) means for forming the thin film by supplying each different source gas of a plurality of source gasses one by one plural times; and (c) means for evacuating or supplying another different gas between the supplying of said each different source gas.

According to this apparatus, the incubation period can be shortened and throughput can be improved, because a pretreatment process for simultaneously supplying a plurality of source gasses can be carried out, prior to the step of supplying each different source gas of a plurality of source gasses one by one plural times using the ALD process.

BRIEF DESCRIPTION OF DRAWINGS

FIG. 9 is a flow-chart illustrating a TiN film forming method according to the another embodiment of the present invention.

BEST MODE FOR CARRYING OUT THE INVENTION

A description will now be given, with reference to the drawings, of embodiments of the present invention.

Figure 3:
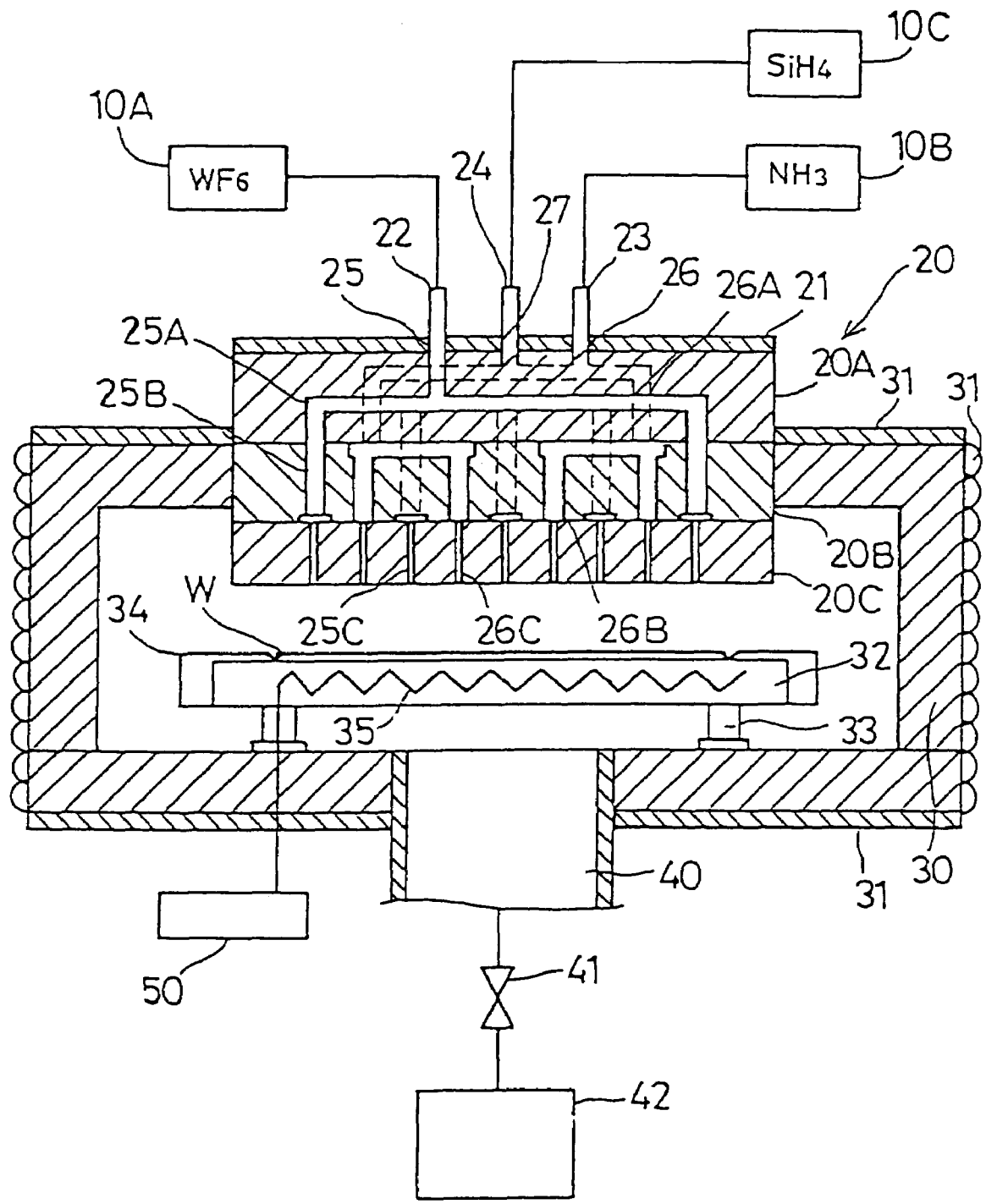
FIG. 3 is a schematic cross-sectional view of a vacuum processing apparatus for forming a thin film in accordance with the present invention.

FIG. 3 shows a schematic cross-sectional view of a thin film forming apparatus (referred to as "a vacuum processing apparatus" hereinafter) for performing a thin film forming method according to one embodiment of the present invention. Prior to an explanation for a thin film forming method, an explanation will be given for the vacuum processing apparatus shown in FIG. 3, which performs the thin film forming method.

This vacuum processing apparatus includes gas supply sources 10A~10C, a shower head 20, a shower head heater 21, a chamber 30, a heater 31, a susceptor 32, supporting members 33, an exhaust pipe 40, a valve 41, a vacuum pump 42, a power supply 50 and so on.

The gas supply sources 10A~10C supply gasses into the chamber 30 via gas inlets 22~24 and gas passages 25, 26, 27 provided at the shower head 20. The supplied gasses perform a predetermined film forming process on a semiconductor wafer W in the chamber 30. In more detail, the gas supply source 10A supplies $WF_6$ gas as a raw gas, the gas supply source 10B supplies $NH_3$ as a raw gas, and the gas supply source 10C supplies $SiH_4$ gas as a raw gas.

The shower head 20 is mounted at and penetrates the upper wall central portion of the chamber 30. In this embodiment, the shower head 20 comprises integrally formed three stage blocks 20A, 20B and 20C. To the gas flow passage 25 (comprising passages 25A, 25B and 25C) provided in the shower head 20, $WF_6$ gas is supplied at a predetermined flow rate via a mass-flow controller (not shown) from the gas supply source 10A.

To the gas flow passage 26 and 27 (comprising passages 26A, 26B and 26C) provided in the shower head 20, $NH_3$ gas and $SiH_4$ gas are supplied at predetermined flow rates via mass-flow controllers (not shown) from the gas supply sources 10B and 10C, respectively. The gas flow passages 25, 26 are arranged so as to uniformly supply each gas into the chamber 30.

The gas flow passage 25 for supplying $WF_6$ and the gas flow passage 26 and 27 for $NH_3$ and $SiH_4$ are separated for the purpose of inhibiting the reaction between $WF_6$, and $NH_3$, $SiH_4$ in the shower head 20. When it is necessary to inhibit the reaction between $SiH_4$ and $NH_3$, the gas flow passage 26 and 27 may be further divided.

Although not shown, the shower head 20 is provided with a gas inlet and a gas flow passage for supplying an inactive gas such as Ar or $N_2$, which dilutes a pretreatment gas and a film forming gas. This gas inlet is connected to an inactive gas supply source via a mass-flow controller.

The shower head heater 21 is mounted on the upper face of the shower head 20. The shower head heater 21 controls the temperature of the shower head 20, heats the gasses flowing through the shower head 20, and inhibits by-products such as $NH_4F$ of a low steam pressure reaction from adhering to the shower head 20. In the chamber 30, predetermined processes are performed on the semiconductor wafer W.

The susceptor 32 is fixed by the supporting members 33 within the chamber 30. The semiconductor wafer W as an object to be processed is transferred by a transferring mechanism (not shown) and placed on the susceptor 32. The susceptor 32 includes a guide ring 34 for guiding the semiconductor wafer W to the center of the susceptor 32, and a stage heater 35 for controlling the temperature of the semiconductor wafer W. The stage heater 35 is supplied with electric power from the power supply 50 external to the chamber 30.

The exhaust pipe 40 is provided at the bottom portion of the chamber 30, and connected to the vacuum pump 42 via the valve 41 adjusting the exhaust gas flow rate. The vacuum pump 42 exhausts gas within the chamber 30 via the exhaust pipe 40, and can pump down the chamber 30 to a vacuum level determined by the pumping ability of the vacuum pump 42 and conductance of the chamber 30, the exhaust pipe 40 and the valve 41, or can maintain the chamber 30 at a predetermined negative pressure.

The inventors of the present invention carried out thin film forming methods using the above mentioned vacuum processing apparatus. These methods are explained below.

Figure 1:
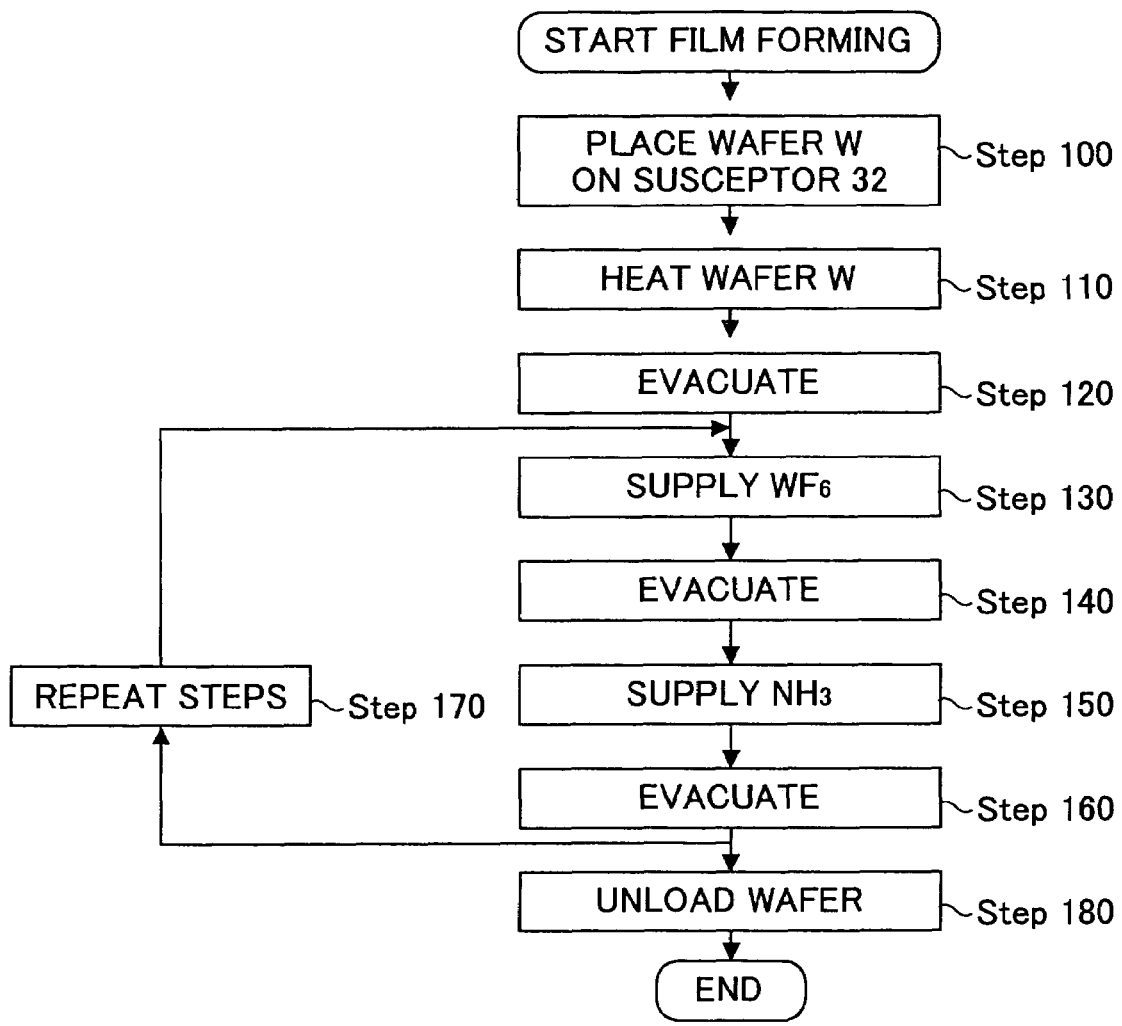
FIG. 1 is a flow-chart illustrating a film forming method according to the conventional ALD process.

The inventors first carried out a conventional ALD film forming process in accordance with a flow chart shown in FIG. 1, to form a film and investigate film forming conditions at the beginning of the film forming process. Each step of the thin film forming process shown in FIG. 1 will be explained below.

At Step 100, a semiconductor wafer W is loaded into the chamber 30, and placed on the susceptor 32 already heated to a predetermined temperature such as 450 degrees Celsius.

At Step 110, while an inactive gas such as Ar or $N_2$ is supplied to the shower head 20, the chamber 30 is evacuated and maintained at 400 Pa, for example. The heat is conducted from the susceptor 32 to the semiconductor wafer W in order to raise the temperature thereof.

At Step 120, the gas supply is stopped and the chamber 30 is further evacuated to lower than 20 Pa, for example.

At Step 130, while $WF_6$ gas mixed with a small amount of Ar, $N_2$ is supplied to the shower head 20, the chamber 30 is evacuated and maintained at a predetermined pressure. And $WF_6$ gas is supplied under the condition of partial pressure×time=470 Pa·sec.

At Step 140, the gas supply is stopped, and the chamber 30 is evacuated to lower than 20 Pa, for example.

At Step 150, while $NH_3$ gas mixed with a small amount of Ar, $N_2$ is supplied to the shower head 20, the chamber 30 is maintained at a predetermined pressure. And $NH_3$ is supplied uniformly onto the wafer W at 470 Pa·sec.

At Step 160, the gas supply is stopped and the chamber 30 is evacuated to a vacuum level lower than 20 Pa, for example.

At Step 170, the above processes from Step 130 through Step 160 are repeated a predetermined number of times.

Figure 2:
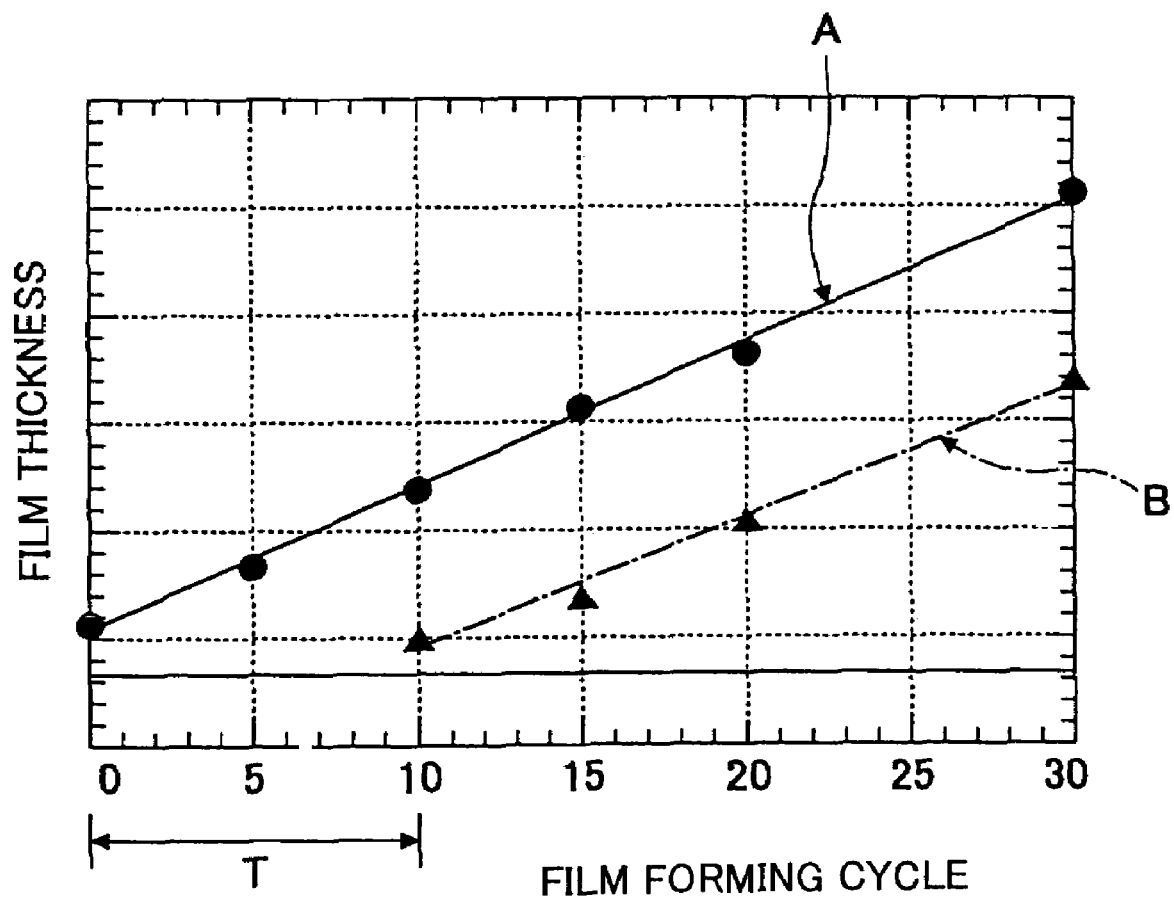
FIG. 2 is a graph showing relations between source gas supplying cycles and thickness of formed films, when carrying out the conventional ALD process and the embodiment process in accordance with the present invention.

Investigation of $W_2N$ films formed by the above ALD process found that the first 10 cycles of film forming process give substantially no film as seen from a one-dot-chain-line B shown in FIG. 2. In other words, there is an incubation period T during the first 10 cycles in the conventional ALD process.

Then the inventors researched a variety of pretreatments to obtain a pretreatment reducing the incubation period T, and found that a pretreatment simultaneously supplying multiple species of source gasses eliminates such an incubation period and therefore a film can be formed even in the first 10 cycles as indicated by a solid line A shown in FIG. 2.

Figure 4:
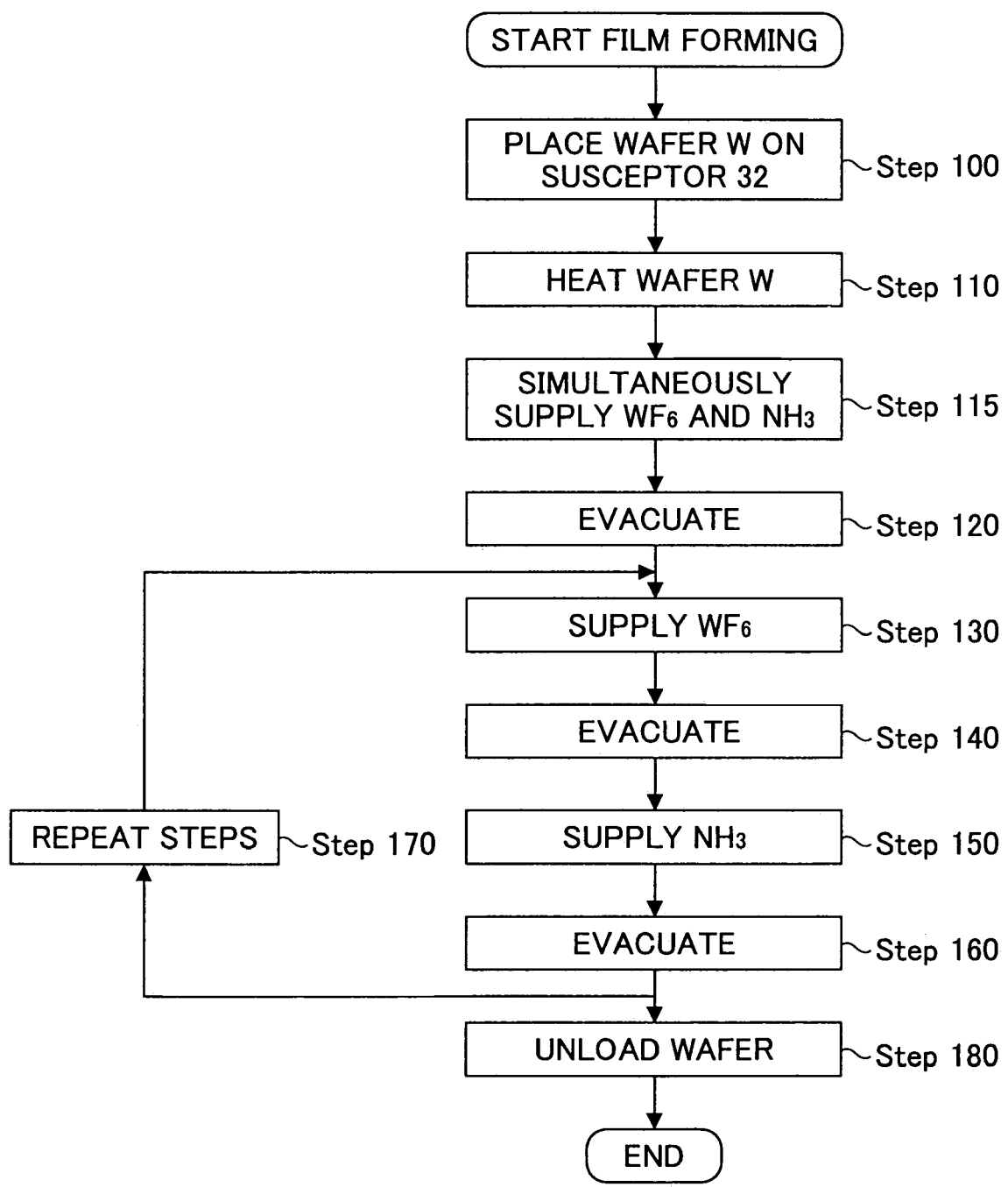
FIG. 4 is a flow-chart illustrating a film forming method according to one embodiment of the present invention.

FIG. 4 shows a flow chart explaining an improved thin film forming method in accordance with an embodiment of the present invention. According to this embodiment, a pretreatment simultaneously supplying multiple species of source gasses is performed as Step 115 between Step 110 and Step 120. An explanation will be given below for each step of a thin film forming process with reference to FIG. 4. In FIG. 4, steps that are the same or substantially the same as the steps shown in FIG. 1 are given the same step numerals.

At Step 100, a semiconductor wafer W is loaded into the chamber 30, and placed on the susceptor 32 already heated to a predetermined temperature such as 450 degrees Celsius.

At Step 110, while an inactive gas such as Ar or $N_2$ is supplied to the shower head 20, the chamber 30 is evacuated and maintained at 400 Pa for example. The heat is conducted from the susceptor 32 to the semiconductor wafer W in order to raise the temperature thereof.

At Step 115, $WF_6$ gas and $NH_3$ gas having predetermined partial pressures and mixed with a small amount of Ar, $N_2$ are simultaneously supplied to the chamber 30 for 7.5 seconds. This pretreatment process time corresponds to a time required for forming a 1 nm film at this flow rate. The partial pressure of $WF_6$ gas is 0.2 Pa and the partial pressure of $NH_3$ is 102 Pa.

At Step 120, the gas supply is stopped and the chamber 30 is further evacuated to lower than 20 Pa, for example.

At Step 130, while $WF_6$ gas mixed with a small amount of Ar, $N_2$ is supplied to the shower head 20, the chamber 30 is evacuated and maintained at a predetermined pressure. And $WF_6$ gas is supplied under the condition of partial pressure×time=470 Pa·sec.

At Step 140, the gas supply is stopped, and the chamber 30 is evacuated to lower than 20 Pa, for example.

At Step 150, while $NH_3$ gas mixed with a small amount of Ar, $N_2$ is supplied to the shower head 20, while the chamber 30 is maintained at a predetermined pressure. And $NH_3$ is supplied uniformly onto the wafer W at 470 Pa·sec.

At Step 160, the gas supply is stopped and the chamber 30 is evacuated to a vacuum level lower than 20 Pa, for example.

At Step 170, the above processes from Step 130 through Step 160 are repeated a predetermined number of times.

The two thin film forming methods respectively illustrated in FIGS. 1 and 4 are explained below in comparison to each other. In case where the processes from Step 130 through Step 160 were repeated 30 cycles in accordance with the thin film forming method shown in FIG. 1, no film was formed during the first 10 cycles, and thereafter a film was formed at a speed of 0.64 nm/cycle during the succeeding 20 cycles to give the final film having a total thickness of 12.8 nm.

On the other hand, in case where the processes from Step 130 to Step 160 were repeated 30 cycles in accordance with the thin film forming method shown in FIG. 4, a film was formed even from the first cycle and the final film had a total thickness of 20.1 nm, improving throughput.

The above embodiment is explained by using one example of the ALD process for forming a $W_2N$ film, including an evacuating step between $WF_6$ gas supply and $NH_3$ gas supply. However, the present invention is not limited to this example and may employ a purge process, in which $WF_6$ gas or $NH_3$ gas is purged out by a predetermined gas, instead of vacuuming. In more detail, after the supply of $WF_6$ gas or $NH_3$ gas is stopped, a great amount (more than 500 sccm, for example) of an inactive gas such as Ar, $N_2$ or $H_2$ is supplied to the chamber 30 to purge out $WF_6$ gas or $NH_3$ gas left within the chamber 30.

Using $H_2$ as a purge gas is effective especially when it is desired not to oxidize a $W_2N$ film. Further, employing vacuuming, purging and vacuuming processes as one set is preferable and highly effective in removing the remaining $WF_6$ gas or $NH_3$ gas, although the total time for forming the film gets longer.

In the above embodiment, the condition for forming a $W_2N$ film with the ALD process is that wafer temperature is 370 degrees Celsius, the supplies of WF6 gas and NH3 gas per one cycle are both 470 Pa·sec, and the amount of W2N film formed per one cycle is about 0.6-0.7 nm. The inventors have experimented with a variety of $W_2N$ film forming conditions and obtained relations shown in FIGS. 5 and 6, as follows.

Figure 5:
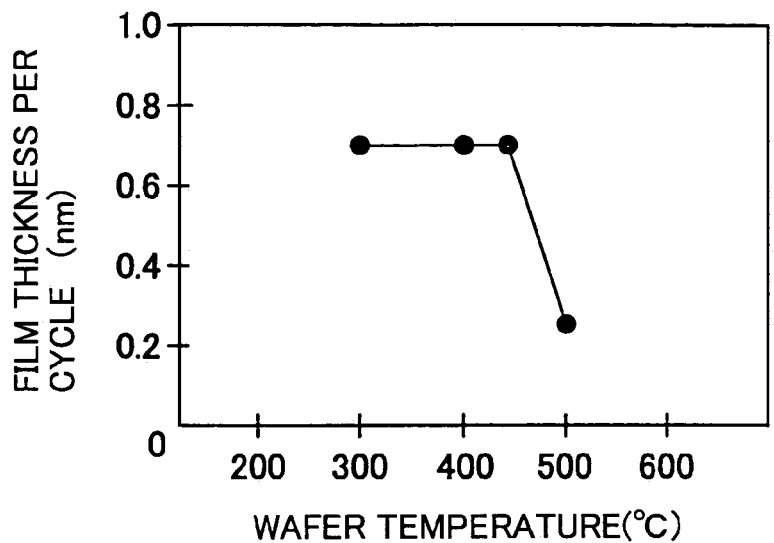
FIG. 5 is a graph showing relations between wafer temperature and a thickness of formed film per one cycle when performing the embodiment of the present invention.

FIG. 5 shows wafer temperature dependency of film thickness formed per cycle. As shown in FIG. 5, within the wafer temperature range from 300 to 400 degrees Celsius, the thickness of a film formed per cycle is constant independent of the wafer temperature. On the other hand, when the wafer temperature exceeds 450 degrees Celsius, the thickness of film formed per cycle is decreased. In the region that the formed film thickness is constant, the reaction occurs with raw gas absorption being a rate-determining process, and therefore the constant region is the preferable region providing a controllable $W_2N$ film having good coverage.

Figure 6:
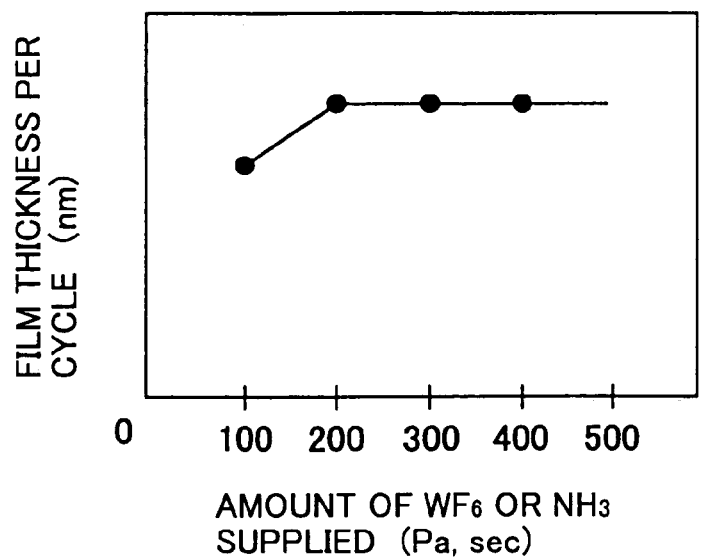
FIG. 6 is a graph showing relations between the amount of supplied $WF_6$ gas or $NH_3$ gas and thickness of formed film per cycle, according to the embodiment of the present invention.

FIG. 6 shows $WF_6$ or $NH_3$ gas supply dependency of film thickness formed per cycle when the experiment was done at wafer temperature 370 degrees Celsius. As shown in FIG. 6, after the amount of gas supply is over 200 Pa·sec, the thickness of the film formed per cycle is saturated. In this region, the reaction occurs with raw gas absorption being a rate-determining process, and therefore this region is the preferable one for providing controllable $W_2N$ film having good coverage.

In the above embodiment, the period of the pretreatment process (Step 115 in FIG. 4) for simultaneously supplying multiple species of source gasses is 7.5 seconds. However, the present invention is not limited to this pretreatment period.

The pretreatment process shown as Step 115 in FIG. 4 is effective in improving wafer surface and the absorbability of source gasses. The minimum period of the pretreatment process is 0.1 second because at least 0.1 second is needed for the raw gas to arrive at the target surface. Even a short period of the pretreatment process is effective as long as the mixture of multiple species of source gasses supplied simultaneously arrives at the target surface.

On the other hand, if the pretreatment process period exceeds a period corresponding to 2.0 nm thickness of film formed, the pretreatment process forms a film on the target surface (wafer surface). Therefore, a film formed by the ALD process is formed in the film made during the pretreatment process.

The film formed during the pretreatment process is formed by multiple species of source gasses simultaneously supplied, and therefore it has poorer coverage, smoothness and purity comparing with a film formed by the ALD process. The film formed during the pretreatment process adversely affects the upper film later formed thereon by the ALD process, and the coverage, smoothness and purity of the ALD film become degraded. Therefore, it is not preferable to perform the pretreatment process over the time period corresponding to a 2.0 nm film.

On the other hand, it is preferable to perform the pretreatment process within the time period corresponding to 2.0 nm, because the raw gas absorption in the ALD process is promoted and the ALD film is not adversely affected.

The 2.0 nm film is very thin and may not be observed even with a scanning electron microscope (SEM). The thickness of the pretreatment film can be controlled by the period or time duration of the pretreatment. Therefore, the above mentioned advantage can be obtained just by controlling the period of the pretreatment process without measuring the thickness of the pretreatment film.

Figure 7:
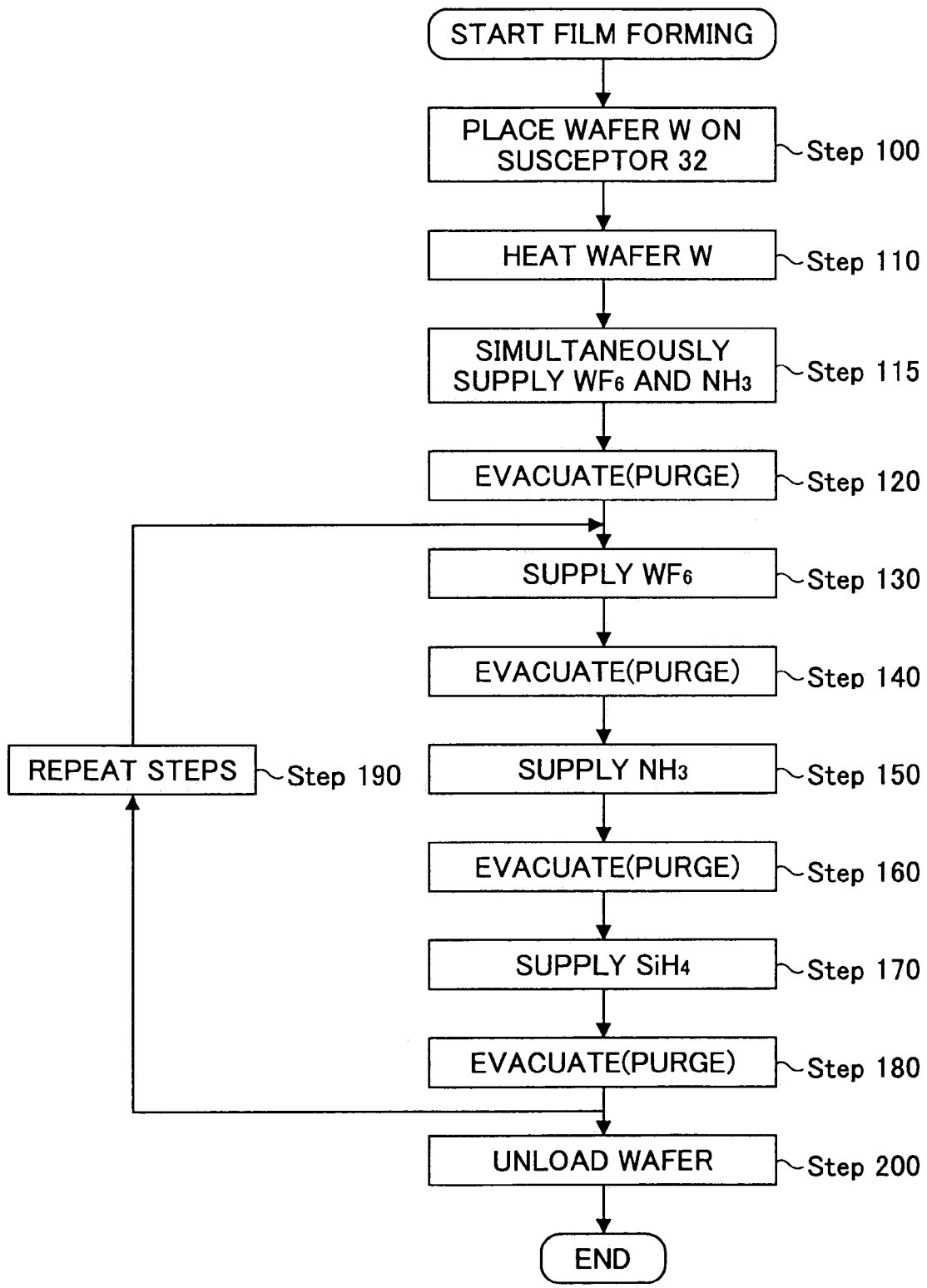
FIG. 7 is a flow-chart illustrating a film forming method according to one embodiment of the present invention.

In the above explained embodiment, $WF_6$ gas and $NH_3$ gas are alternatingly supplied in the ALD process to get a $W_2N$ film. The present invention, however, is not limited to this, and may repeatedly supply $WF_6$ gas, $NH_3$ gas, $SiH_4$ gas in this order as shown in FIG. 7.

In this case, since WF$_6$ gas is supplied immediately after supplying SiH$_4$ gas, W or WSi$_x$ is formed and a mixture film (WN$_x$ film) can be formed in W$_2$N film. Since W or WSi$_x$ has a lower specific resistance compared to W$_2$N, amounts of W and WSi$_x$ in the WN$_x$ film can be controlled by changing the amount of each of the supplied gas or changing the order of supplying gasses. Thereby it becomes possible to decrease specific resistance compared to a W$_2$N single film or to put Si in the film to get a thin film having the desired characteristics. For example, if WF$_6$, SiH$_4$, NH$_3$, WF$_6$, SiH$_4$ are supplied in this order repeatedly, then the ratio of W$_2$N in a WN$_x$ film is decreased and the ratio of W and WSi$_x$ are increased, and a low specific resistant WN$_x$ film can be obtained.

In the above embodiment, the vacuum processing apparatus shown in FIG. 3 is used, and the shower head 20 is used when simultaneously supplying multiple species of source gasses at the pretreatment process and when repeatedly supplying multiple species of source gasses separately for forming a film by the ALD film forming process.

Figure 8:
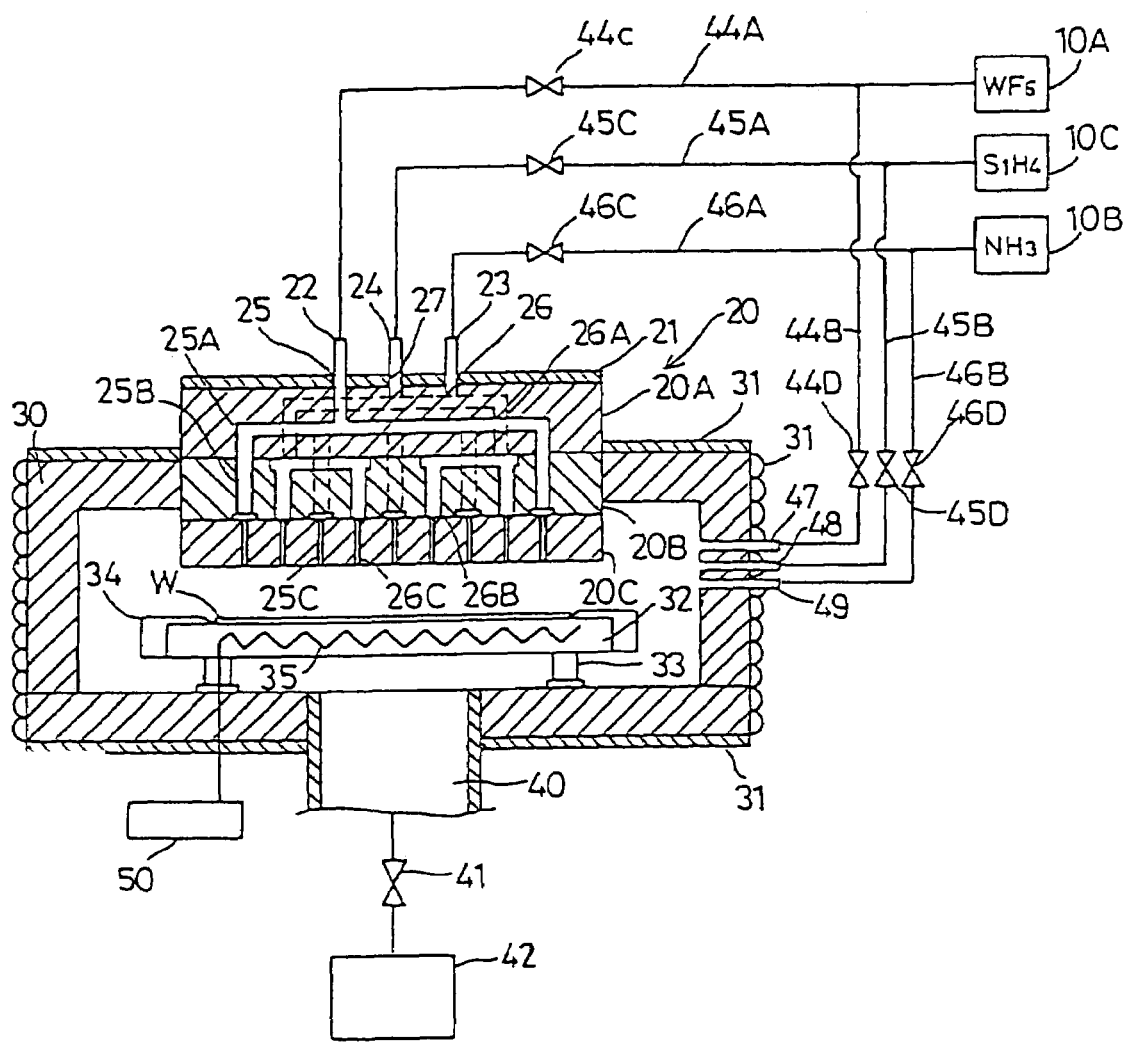
FIG. 8 is a schematic cross-sectional view of a vacuum processing apparatus for carrying out another embodiment of the present invention.

The present invention, however, is not limited to this embodiment, and may employ a different supplying system as shown in FIG. 8 (the same numerals are given to the same members as in FIG. 3), in which the shower head 20 is used at the pretreatment process, but each gas is supplied to the chamber 30 from the side of the chamber when performing the ALD process.

In more detail, gas supplying pipes respectively connected to each of gas supply sources 10A~10C branch to pipes 44A~46A and pipes 44B~46B. The pipes 44A~46A are connected to the shower head 20, and the pipes 44B~46B are connected to nozzles 47~49, respectively, mounted at one side of the chamber 30. The pipes 44A~46A have valves 44C~46C, and the pipes 44B~46B have valves 44D~46D, to control amounts of gasses flowing through the pipes 44A~46A and the pipes 44B~46B, respectively.

In the pretreatment process, the shower head 20 is necessary for simultaneously supplying multiple species of source gasses onto a surface of a wafer W uniformly. Therefore, in the pretreatment process, the valves 44D~46D are closed and the valves 44C~46C are opened to supply source gasses to the shower head 20. On the other hand, when forming a film with the ALD process, the valves 44C~46C are closed and the valves 44D~46D are opened to supply source gasses to the chamber 30 from the side.

When performing the ALD process to form a film, there is no problem in using the nozzles 47~49 for supplying gasses, because the raw gas absorption process is a rate-determining process. From the viewpoint of gas exchange, the nozzles 47~49 of simple structures are more advantageous and preferable than the shower head 20 of less conductance.

In the above mentioned embodiments using the ALD film forming process, WF$_6$ gas and NH$_3$ gas are alternatingly supplied to form a W$_2$N film, and WF$_6$ gas, NH$_3$ gas and SiH$_4$ gas are alternatingly supplied to form a WN$_x$ film. The present invention, however, is not limited to this, and of course may be applied to other film formation such as metal films, insulator films.

An explanation is given below for another embodiment to form TiN by alternatingly supplying TiCl$_4$ gas and NH$_3$ gas with reference to FIG. 9.

At Step 300, a semiconductor wafer W is loaded into the chamber 30, and placed on the susceptor 32 already heated to a predetermined temperature such as 450 degrees Celsius.

At Step 310, while an inactive gas such as Ar or N$_2$ is supplied to the shower head 20, the chamber 30 is evacuated and maintained at 400 Pa for example. The heat is conducted from the susceptor 32 to the semiconductor wafer W in order to raise the temperature thereof.

At Step 315, TiCl$_4$ gas and NH$_3$ gas having predetermined partial pressures and mixed with a small amount of Ar, N$_2$ are simultaneously supplied to the chamber 30 for 10 seconds, as a pretreatment process. This pretreatment process time corresponds to a time required for forming a 2 nm WN film at this flow rate. The partial pressure of TiCl$_4$ gas is 23 Pa and the partial pressure of NH$_3$ is 301 Pa.

At Step 320, the gas supply is stopped and the chamber 30 is further evacuated to lower than 20 Pa, for example.

At Step 330, while TiCl$_4$ gas mixed with a small amount of Ar, N$_2$ is supplied to the shower head 20, the chamber 30 is evacuated and maintained at a predetermined pressure. And WF$_6$ gas is supplied under the condition of partial pressure× time=260 Pa·sec.

At Step 340, the gas supply is stopped, and the chamber 30 is evacuated to lower than 20 Pa, for example.

At Step 350, while NH$_3$ gas mixed with a small amount of Ar, N$_2$ is supplied to the shower head 20, the chamber 30 is maintained at a predetermined pressure. And NH$_3$ is supplied uniformly onto the wafer W at 665 Pa·sec.

At Step 360, the gas supply is stopped and the chamber 30 is evacuated to a vacuum level lower than 20 Pa, for example.

At Step 370, the above processes from Step 330 through Step 360 are repeated a predetermined number of times to get a film having a total-thickness of 14 nm.

When Step 315 was not performed, no film was formed during the first 8 cycles of the repeated steps from Step 370 to Step 330, and the thickness of the final film after 100 cycles was 12.8 nm.

In this embodiment using the ALD process for forming a TiN film, the chamber is evacuated between the TiCl$_4$ gas supply and the NH$_3$ gas supply. The present invention is not limited to this and may employ a purging process, in which after stopping the supply of TiCl$_4$ gas or NH$_3$ gas, a great amount (for example more than 500 sccm) of an inactive gas such as Ar, N$_2$ or H$_2$ is supplied to the chamber 30 to purge out the TiCl$_4$ gas or NH$_3$ gas remaining in the chamber 30. H$_2$ is advantageous especially when it is desired not to oxidize a WN film. Further, employing vacuuming, purging and vacuuming processes as one set is preferable and highly effective in removing the remaining WF$_6$ gas or NH$_3$ gas, although the total time for forming the film gets longer.

As above explained, in accordance with the embodiments of the present invention, a pretreatment process is performed for simultaneously supplying multiple species of source gasses, prior to the conventional ALD process for forming a film by alternatingly supplying different source gasses, thereby the incubation period can be shortened to improve throughput in the film forming process.

The present invention is not limited to these embodiments, but various variations and modifications may be made without departing from the scope of the present invention.

The invention claimed is:

1. A method for forming a thin film on a substrate by causing a plurality of source gasses to react on the substrate, comprising:
   (a) pretreating the substrate by simultaneously supplying at least two source gasses of said plurality of source gasses; and
   (b) after pretreating the substrate, separately supplying each different source gas of said plurality of source gasses a predetermined number of times to form the thin film;
   wherein there is no separate supplying of source gasses before the pretreatment step.

2. The method as claimed in claim 1, further comprising:
(c) evacuating or supplying another different gas, between the separately supplying of said each source gas.

3. The method as claimed in claim 1, wherein said source gasses are $WF_6$ gas, $NH_3$ gas and $SiH_4$ gas.

4. The method as claimed in claim 3, wherein a supply period for the step of simultaneously supplying at least two source gasses of said plurality of source gasses has a lower limit and an upper limit, and the lower limit is 0.1 second and the upper limit is the time it takes for a 2.0 nm thick film to be formed.

5. The method as claimed in claim 1, wherein said source gasses are $TiCl_4$ gas and $NH_3$ gas.

6. A method for forming a thin film on a substrate by causing a plurality of source gasses to react on the substrate comprising:
(a) pretreating the substrate by simultaneously supplying a first source gas having an ingredient of the thin film and a second source gas reacting with the first source gas; and
(b) performing an atomic layer deposition step after the pretreatment by separately supplying a third source gas having an ingredient of the thin film and a fourth source gas reacting with the third gas a predetermined number of times;
wherein there is no separate supplying of source gasses before the pretreatment step.

7. The method as claimed in claim 6, wherein said first source gas and the third source gas are the same.

8. The method as claimed in claim 6, wherein said second source gas and the fourth source gas are the same.

9. The method as claimed in claim 6, further comprising, before the pretreatment step, providing the substrate in a chamber having a predetermined pressure and heating the substrate to a predetermined temperature.

10. A method for pretreating a substrate for an atomic layer deposition process used to form a thin film, the pretreating method comprising:
providing the substrate in a chamber having a predetermined pressure;
heating the substrate to a predetermined temperature; and
after heating the substrate, simultaneously supplying first and second source gasses, the first source gas having an ingredient of the thin film, the second source gas reacting with the first source gas;
wherein there is no separately supplying of the first and second source gasses prior to the simultaneously supplying step.

11. The method as claimed in claim 10, wherein the first and second source gasses are simultaneously supplied for at least 0.1 seconds.

12. The method as claimed in claim 10, wherein the first and second source gasses are simultaneously supplied for a longer limit period of time corresponding to the time it takes to form a 2.0 nm thickness pretreatment film.

* * * * *